United States Patent
Apel et al.

(10) Patent No.: US 6,529,079 B2
(45) Date of Patent: Mar. 4, 2003

(54) RF POWER AMPLIFIER WITH DISTRIBUTED BIAS CIRCUIT

(75) Inventors: Thomas R. Apel, Portland, OR (US); Robert E. Knapp, Portland, OR (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 09/753,110

(22) Filed: Dec. 29, 2000

(65) Prior Publication Data

US 2002/0084854 A1 Jul. 4, 2002

(51) Int. Cl.[7] .................................................. H03F 3/04
(52) U.S. Cl. ...................................... 330/296; 330/288
(58) Field of Search .................................. 330/288, 296

(56) References Cited

U.S. PATENT DOCUMENTS

| | | | | |
|---|---|---|---|---|
| 5,754,066 A | * | 5/1998 | Smith | 327/108 |
| 5,874,852 A | * | 2/1999 | Brambilla et al. | 323/315 |
| 5,923,217 A | * | 7/1999 | Durec | 330/288 |
| 6,043,714 A | * | 3/2000 | Yamamoto et al. | 330/296 |
| 6,278,326 B1 | * | 8/2001 | Murray et al. | 323/315 |

* cited by examiner

*Primary Examiner*—Patricia T. Nguyen
(74) *Attorney, Agent, or Firm*—Skjerven Morrill LLP; Christopher B. Allenby

(57) ABSTRACT

An improved amplifier circuit is disclosed. In one embodiment, the amplifier circuit includes an amplifier transistor that has a base terminal connected to receive an input signal. The amplifier circuit also includes a reference voltage source that generates a reference voltage at a reference voltage output node. A local bias circuit provides a bias voltage to the base terminal of the amplifier transistor. The local bias circuit includes a first transistor that has an emitter terminal coupled to the reference voltage output node, a collector terminal coupled to a supply voltage node, and a base terminal connected to the collector terminal. The local bias circuit also includes a second transistor that has a base terminal coupled to the base terminal of the first transistor, a collector terminal coupled to the supply voltage node, and an emitter terminal coupled to the base terminal of the amplifier transistor. The bias circuit provides a robust, thermally compensated bias voltage to any number of amplifier cells. The bias circuit is ballasted to prevent thermal runaway in any one of the amplifier cells.

20 Claims, 3 Drawing Sheets

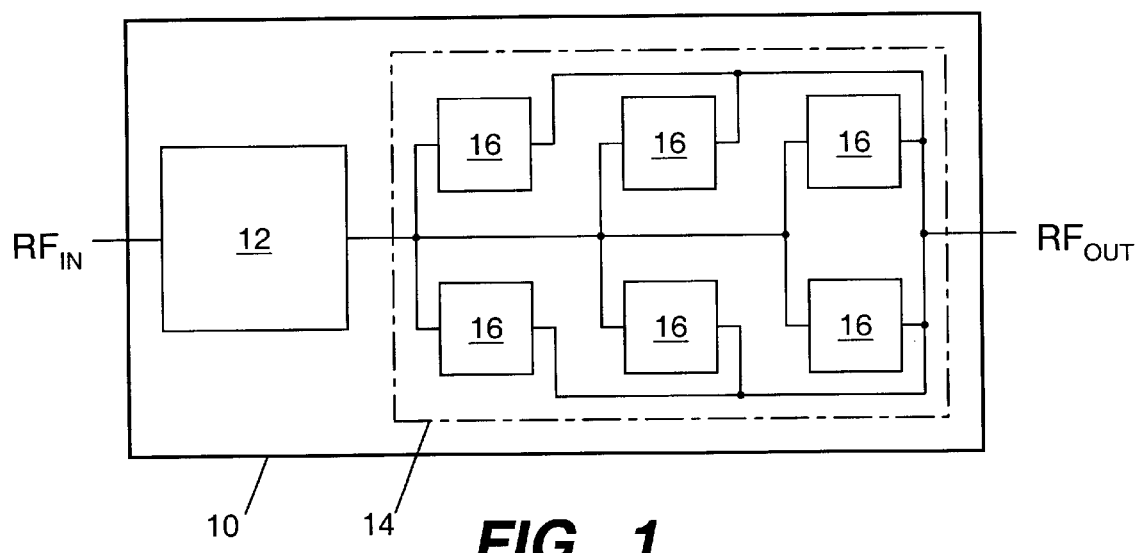
FIG._1
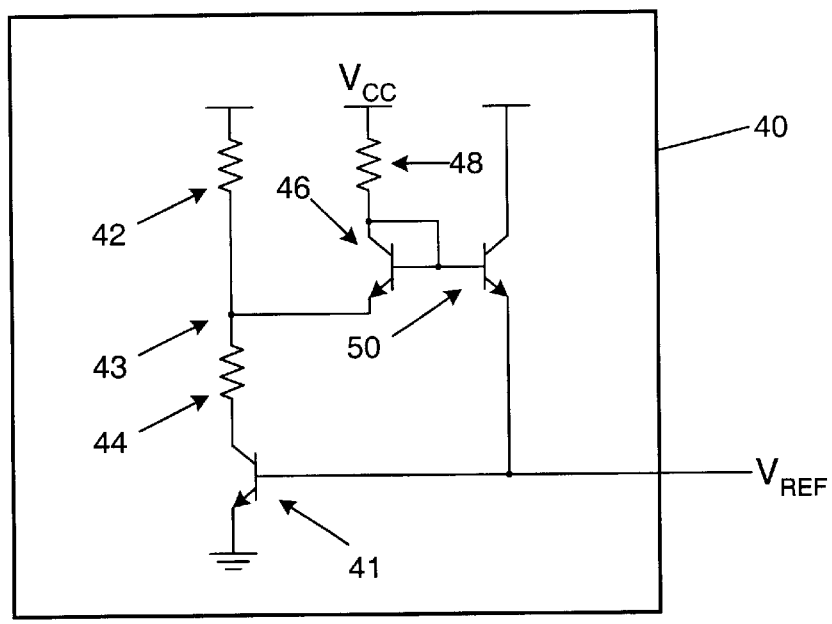
FIG._3

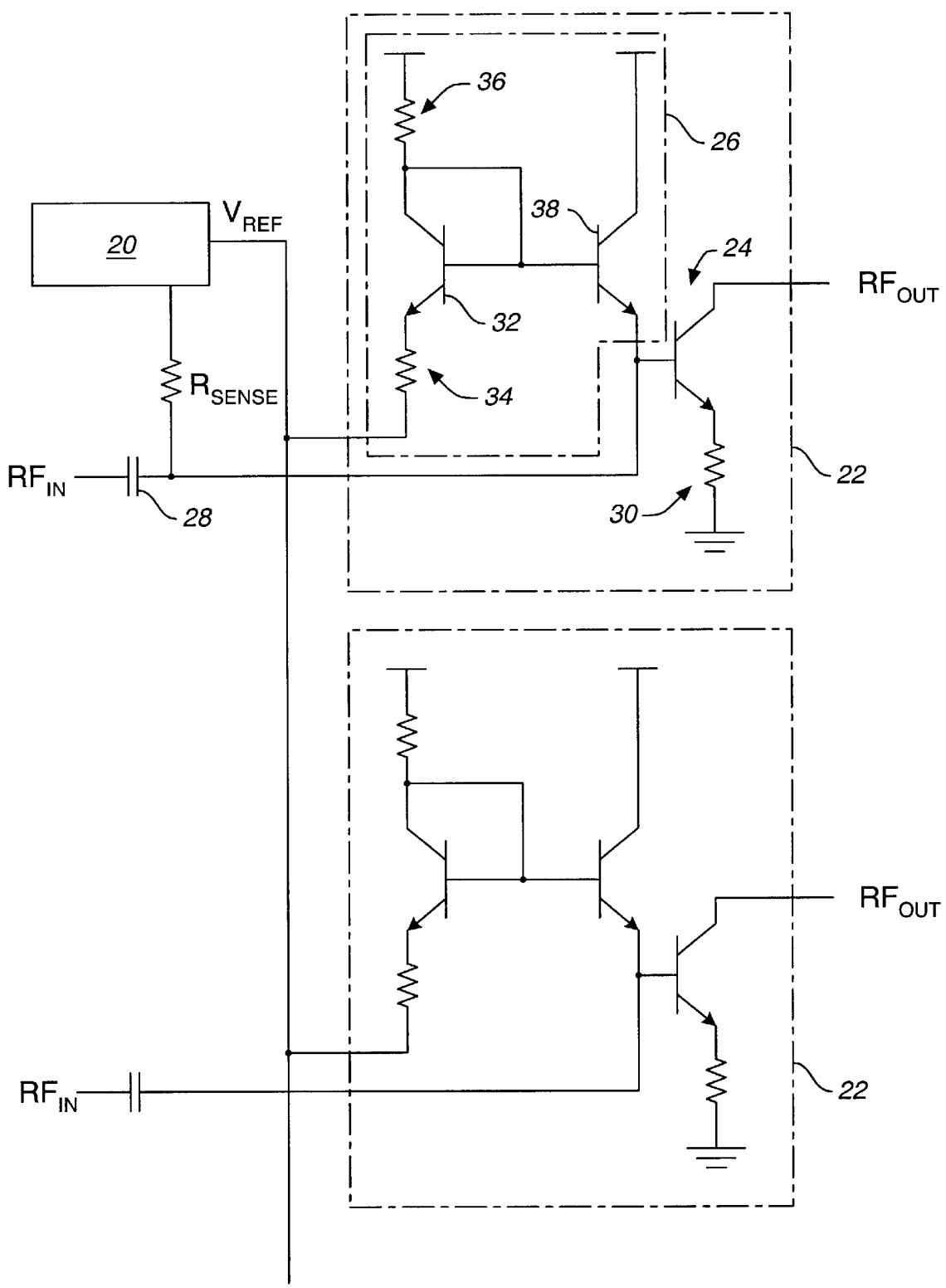
FIG._2

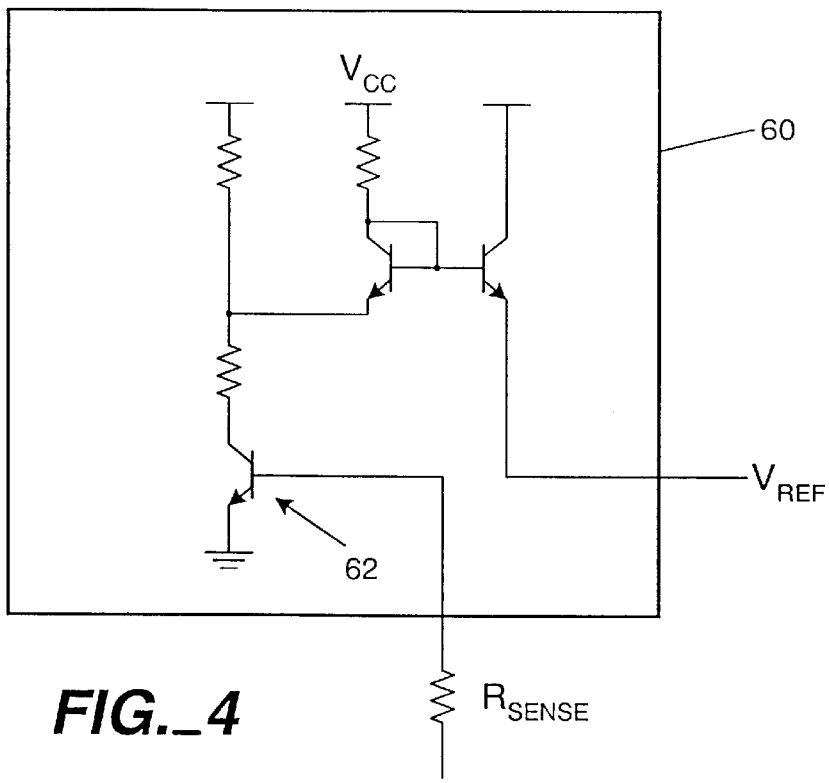
FIG._4
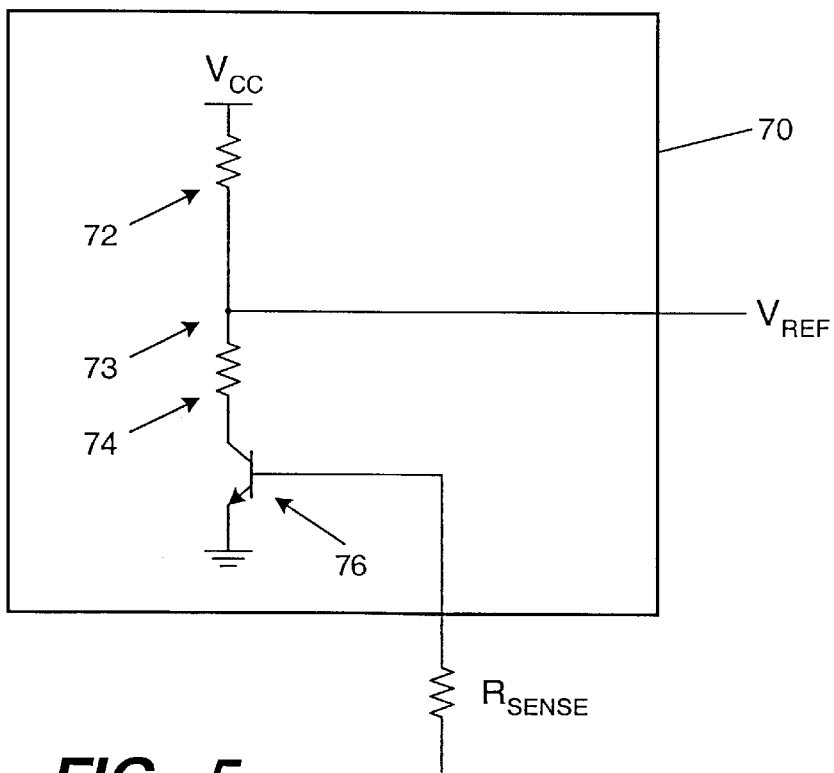
FIG._5

RF POWER AMPLIFIER WITH DISTRIBUTED BIAS CIRCUIT

TECHNICAL FIELD OF THE INVENTION

The present invention relates to power amplifiers, and in particular to an RF power amplifier with a distributed bias circuit.

BACKGROUND OF THE INVENTION

In the field of bipolar radiofrequency (RF) power amplifiers, the biasing of the amplifying transistor(s) is crucial in determining the class of operation and the linearity of amplifier response. Various conventional biasing schemes for such amplifiers are known. These biasing schemes must typically balance competing considerations such as linearity, noise figure, distortion and power consumption.

It is well known that a bipolar transistor is subject to thermal instability and runaway if it is not properly biased. Thus, in power amplifiers, amplifying transistors are commonly ballasted for thermal stability by applying degeneration (ballast resistors) in the base and/or emitter DC current paths.

While base ballast resistors provide thermal stability, they can adversely affect amplifier performance. A base ballast resistor must be relatively large to provide adequate temperature compensation. As input signal power is increased, the large resistance in the base DC path reduces the amount of power available at the amplifier output. As a result, a base-ballasted amplifier exhibits non-linear response.

A distributed base bias circuit is described in U.S. Pat. No. 5,150,076, entitled "Emitter-Grounded Amplifier Circuit With Bias Circuit." This active bias scheme eliminates some of the disadvantages of base ballast resistors. However, the scheme described in that patent exhibits undesirable thermal characteristics. Moreover, the device's sensitivity to supply voltage fluctuations requires a relatively high supply voltage to be used, making the amplifier less suitable for portable applications such as cellular telephones.

SUMMARY OF THE INVENTION

Therefore, a need has arisen for an RF power amplifier that addresses the disadvantages and deficiencies of the prior art. In particular, a need has arisen for an RF power amplifier with a robust, thermally compensated biasing scheme.

Accordingly, an improved amplifier circuit is disclosed. In one embodiment, the amplifier circuit includes an amplifier transistor that has a base terminal connected to receive an input signal. The amplifier transistor amplifies the input signal to generate an output signal. A reference voltage source generates a reference voltage at a reference voltage output node. A local bias circuit provides a bias voltage to the base terminal of the amplifier transistor. The local bias circuit includes a first transistor that has an emitter terminal coupled to the reference voltage output node, a collector terminal coupled to a supply voltage node, and a base terminal connected to the collector terminal. The local bias circuit also includes a second transistor that has a base terminal coupled to the base terminal of the first transistor, a collector terminal coupled to the supply voltage node, and an emitter terminal coupled to the base terminal of the amplifier transistor.

An advantage of the present invention is that a robust, thermally compensated bias voltage is provided to any number of amplifier cells. Another advantage of the present invention is that the bias circuit is ballasted to prevent thermal runaway in any one of the amplifier cells.

BRIEF DESCRIPTION OF THE DRAWINGS

For a more complete understanding of the present invention and for further features and advantages, reference is now made to the following description taken in conjunction with the accompanying drawings, in which:

FIG. 1 is a block diagram of an RF power amplifier;

FIG. 2 is a schematic diagram in partial block form of an amplifier circuit using a distributed bias arrangement in accordance with the present invention;

FIG. 3 is a schematic diagram of a reference voltage source for use in the amplifier circuit;

FIG. 4 is a schematic diagram of an alternative reference voltage source for use in the amplifier circuit; and FIG. 5 is a schematic diagram of another alternative reference voltage source for use in the amplifier circuit.

DETAILED DESCRIPTION OF THE INVENTION

The preferred embodiments of the present invention and their advantages are best understood by referring to FIGS. 1 through 5 of the drawings. Like numerals are used for like and corresponding parts of the various drawings.

Referring to FIG. 1, a block diagram of an RF power amplifier 10 is shown. RF power amplifier 10 may reside on a single integrated circuit chip, such as a gallium arsenide integrated circuit chip. RF power amplifier 10 receives an RF input signal $RF_{IN}$ and generates an RF output signal $RF_{OUT}$. RF power amplifier 10 has a first amplifier stage 12 which provides an initial amplification of the RF input signal $RF_{IN}$. This amplified signal is provided to a second amplifier stage 14. In order to drive the output signal $RF_{OUT}$ with sufficient power, amplifier stage 14 has a plurality of amplifier cells 16 connected in parallel.

Referring to FIG. 2, a schematic diagram in partial block form of an amplifier circuit 18 using a distributed bias arrangement is shown. Amplifier circuit 18 is a multi-cellular amplifier circuit which may be used as the second amplifier stage 14 of RF power amplifier 10.

Amplifier circuit 18 includes a reference voltage source 20 which supplies a reference voltage to a set of individually biased amplifier cells 22. As described below, in one embodiment reference voltage source 20 provides a reference voltage approximately equal to one transistor threshold voltage. While only two amplifier cells 22 are shown in FIG. 2 for purposes of illustration, it will be understood that amplifier circuit 18 may include any number of amplifier cells 22. Amplifier cells 22 may be identical in structure.

Each amplifier cell 22 receives the RF input signal $RF_{IN}$ for amplifier circuit 18. The input signal $RF_{IN}$ is provided to the base of an amplifying transistor 24. The collectors of the amplifying transistors 24 from the various amplifier cells 22 may be connected together to provide an output signal $RF_{OUT}$.

A local bias circuit 26 receives the reference voltage from reference voltage source 20 and a generates a bias voltage at the base of amplifying transistor 24. Because the amplifying transistor 24 of each amplifier cell 22 is individually biased, a DC blocking capacitor 28 provides DC isolation at the input of each amplifier cell 22. An optional sense resistor $R_{SENSE}$ may be connected between the base of amplifying transistor 24 and reference voltage source 20. This sense resistor may provide additional control of the amplifier base bias voltage, as will be described below.

Each amplifier cell 22 includes an emitter ballast resistor 30 connected between the emitter of amplifying transistor 24 and ground. Emitter ballast resistor 30 provides thermal stabilization for the amplifier cell 22. As is well known to those of skill in the art, a base ballast resistor (not shown) may be connected between the base of amplifying transistor 24 and local bias circuit 26. This base ballast resistor also provides thermal stabilization, and may be used instead of or in addition to emitter ballast resistor 30. However, as will be described below, due to the ballasting features of local bias circuit 26, a base ballast resistor is unnecessary and emitter ballast resistor 30 may have a very small resistance or may be eliminated entirely.

The local bias circuit 26 of each amplifier cell includes a first transistor 32 with an emitter coupled to the output of reference voltage source 20 via a resistor 34. The base and collector of transistor 32 are connected together, and both are coupled to a supply voltage $V_{CC}$ via a resistor 36. A second transistor 38 has its base connected to the base and collector of transistor 32. The collector of transistor 38 is connected to $V_{CC}$. The emitter of transistor 38 is coupled to the base of amplifying transistor 24. A base ballast resistor (not shown) may optionally be connected between the emitter of transistor 38 and the base of amplifying transistor 24. Alternatively, the emitter of transistor 38 may be directly connected to the base of amplifying transistor 24, as shown in FIG. 2.

The operation of local bias circuit 26 is as follows. Transistor 32 is configured as a level shifter. Thus, resistors 34 and 36 determine the voltage at the base of transistor 32. This voltage is provided to the base of transistor 38, which acts as an emitter follower. The voltage at the emitter of transistor 38 is provided as a base bias voltage to amplifying transistor 24.

An increase in temperature of transistor 38 would, if uncompensated, decrease the base-emitter voltage drop of transistor 38, thereby increasing the base bias voltage of amplifying transistor 24. However, transistor 32 is matched to transistor 38 and experiences the same $V_{be}$ decrease as transistor 38. Thus, because transistors 32 and 38 are located in physical (thermal) proximity to each other, the $V_{be}$ decrease of transistor 38 is offset by a decrease in base voltage of transistor 32. In this manner, local bias circuit 26 is automatically thermally compensated to produce the same bias voltage at different temperatures.

A further ballasting effect is provided by resistors 34 and 36. When increased bias current is drawn by amplifying transistor 24, the base current of transistor 38 also increases. This increased base current is drawn from the base and collector of transistor 32, thereby decreasing the current through transistor 32 and resistor 34 without decreasing the current through resistor 36. This current change affects the voltage dividing characteristics of resistors 34 and 36 and transistor 32, causing the voltage at the base of transistors 32 and 38 to drop. The decreasing base voltage of transistor 38 causes a decrease in the bias voltage provided to amplifying transistor 24, thereby counteracting the increase in current drawn by amplifying transistor 24.

As will be apparent to those skilled in the art, the sizes of resistors 34 and 36 determine the amount of ballasting provided by local bias circuit 26. Larger resistors 34 and 36 increase the ballasting effect. However, resistor 34 also limits the previously-described ability of transistor 32 to compensate for a thermally-induced drop in $V_{be}$ for transistor 38. Thus, the size of resistor 34 must be chosen to achieve an appropriate compromise of these two features.

Referring to FIG. 3, a schematic diagram of a reference voltage source 40 for use in amplifier circuit 18 is shown. As described below, reference voltage source 40 is capable of generating a robust, stable reference voltage $V_{REF}$ at the base of a bipolar transistor 41. Since transistor 41 has a grounded emitter, reference voltage $V_{REF}$ is approximately one threshold voltage above ground.

The collector of transistor 41 is connected to the supply voltage $V_{CC}$ through two resistors 42 and 44. The emitter of a transistor 46 is connected to a node 43 between resistors 42 and 44. Transistor 46 is connected in a diode configuration in series with a resistor 48, which is in turn connected to $V_{CC}$. Another transistor 50 has its base connected to the base of transistor 46 in an emitter follower configuration. Transistor 50 has its collector connected to $V_{CC}$ and its emitter connected to the base of transistor 41. Transistors 41, 46 and 50 may be, for example, heterojunction bipolar transistors (HBTs).

The operation of reference voltage source 40 is as follows. With no load connected to $V_{REF}$, reference voltage source 40 establishes steady-state value of $V_{REF}$ at the threshold voltage of transistor 41. When a load draws current from the base of transistor 41, a resulting voltage sag will decrease the current through transistor 41, thereby raising the voltage at node 43. Transistor 46 acts as a level shifter, providing a voltage to the base of transistor 50 that is one threshold voltage above the voltage at node 43. Thus, a voltage increase at node 43 causes a voltage increase at the base of transistor 50. The increase in base voltage and the decrease in $V_{REF}$ cause transistor 50 to conduct more current, counteracting the voltage sag in $V_{REF}$.

This negative feedback loop provides a great deal of stability for $V_{REF}$. The responsiveness of the feedback loop is determined primarily by the values of resistors 42 and 44, the beta values of transistors 41 and 50 and the voltage difference between $V_{CC}$ and the collector of transistor 41. For maximum responsiveness, resistor 44 has a small resistance compared to that of resistor 42. In one embodiment, resistor 44 may be omitted entirely (R=0). In this embodiment, optional sense resistor $R_{SENSE}$ shown in FIG. 2 is not used.

Referring to FIG. 4, a schematic diagram of an alternative reference voltage source 60 for use in amplifier circuit 18 is shown. Reference voltage source 60 may be used in conjunction with the optional sense resistor $R_{SENSE}$ of amplifier circuit 18 (FIG. 2) to provide further stabilization of the base bias voltage of amplifying transistor 24.

Reference voltage source 60 is similar in structure to reference voltage source 40 described above. Reference voltage source 60 operates in the same manner as reference voltage source 40 described above, except that transistor 62 receives its base voltage from the base of amplifying transistor 24 via sense resistor $R_{SENSE}$. Thus, the feedback path for reference voltage source 60 includes local bias circuit 26. Since transistor 62 senses the base bias voltage of amplifying transistor 24 rather than reference voltage $V_{REF}$, imperfect voltage buffering by local bias circuit 26 (for example due to thermal variation) may be compensated for at reference voltage source 60. Reference voltage source 60 therefore provides additional stabilization of the base bias voltage of amplifier circuit 18.

Referring to FIG. 5, a schematic diagram of another alternative reference voltage source 70 for use in amplifier circuit 18 is shown. Reference voltage source 70 may be used in conjunction with the optional sense resistor $R_{SENSE}$ of amplifier circuit 18 (FIG. 2) to provide stabilization of the base bias voltage of amplifying transistor 24.

Reference voltage source 70 is somewhat similar in design to reference voltage source 60 described above. Reference voltage source 70 operates in the same manner as reference voltage source 60 described above, except that the node 73 between resistors 72 and 74 sets the reference voltage $V_{REF}$ directly, without the use of further level-shifting circuitry. Reference voltage source 70 therefore has a smaller, simpler circuit design than reference voltage source 60. Like reference voltage source 60, reference voltage source 70 receives feedback through local bias circuit 26 and sense resistor $R_{SENSE}$ to provide bias voltage stabilization for amplifier cells 22.

Referring to FIG. 2, sense resistor $R_{SENSE}$ is connected to the base of only one amplifier transistor 24 of amplifier circuit 18. Thus, thermal variation among the amplifier cells 22 will not be taken into account in reference voltage sources 60 or 70 described above. However, the ballasting effect of local bias circuit 26, which prevents thermal runaway, ensures that the amplifier cells 22 will have approximately the same temperature. Thus, reference voltage sources 60 and 70 provide excellent bias voltage stabilization for all amplifier cells 22.

Although the present invention and its advantages have been described in detail, it should be understood that various changes, substitutions, and alterations can be made therein without departing from the spirit and scope of the invention as defined by the appended claims.

We claim:

1. An amplifier circuit comprising:
   an amplifier transistor having a base terminal connected to receive an input signal, the amplifier transistor being operable to amplify the input signal to generate an output signal;
   a reference voltage source operable to generate a reference voltage at a reference voltage output node; and
   a local bias circuit operable to provide a bias voltage to the base terminal of the amplifier transistor, the local bias circuit having:
      a first transistor having an emitter terminal coupled to the reference voltage output node, the first transistor having a collector terminal coupled to a supply voltage node, the first transistor having a base terminal connected to the collector terminal of the first transistor;
      a second transistor having a base terminal coupled to the base terminal of the first transistor, the second transistor having a collector terminal coupled to the supply voltage node, the second transistor having an emitter terminal coupled to the base terminal of the amplifier transistor; and
      a resistor having a first terminal connected to the reference voltage output node, the resistor having a second terminal connected to the emitter terminal of the first transistor.

2. The amplifier circuit of claim 1, wherein the local bias circuit further comprises a second resistor having a first terminal connected to the supply voltage node, the second resistor having a second terminal connected to the collector terminal of the first transistor.

3. The amplifier circuit of claim 1, wherein the amplifier transistor comprises a first amplifier transistor, and wherein the local bias circuit comprises a first local bias circuit, the amplifier circuit further comprising:

a second amplifier transistor having a base terminal connected to receive the input signal, the second amplifier transistor being connected in parallel with the first amplifier transistor to generate the output signal; and
a second local bias circuit operable to provide a bias voltage to the base terminal of the second amplifier transistor, the second local bias circuit having:
   a third transistor having an emitter terminal coupled to the reference voltage output node, the third transistor having a collector terminal coupled to the supply voltage node, the third transistor having a base terminal connected to the collector terminal of the third transistor;
   a fourth transistor having a base terminal coupled to the base terminal of the third transistor, the fourth transistor having a collector terminal coupled to the supply voltage node, the fourth transistor having an emitter terminal coupled to the base terminal of the amplifier transistor; and
   a second resistor having a first terminal connected to the reference voltage output node, the second resistor having a second terminal connected to the emitter terminal of the third transistor.

4. The amplifier circuit of claim 1, wherein the reference voltage source comprises:
   a third transistor having a base terminal coupled to the reference voltage output node and an emitter terminal coupled to ground;
   a second resistor having a first terminal coupled to the supply voltage node, the second resistor having a second terminal coupled to a collector terminal of the third transistor;
   a fourth transistor having an emitter terminal coupled to the collector terminal of the third transistor, the fourth transistor having a collector terminal coupled to the supply voltage node, the fourth transistor having a base terminal connected to the collector terminal of the fourth transistor; and
   a fifth transistor having a base terminal coupled to the base terminal of the fourth transistor, the fifth transistor having a collector terminal coupled to the supply voltage node, the fifth transistor having an emitter terminal coupled to the reference voltage output node.

5. The amplifier circuit of claim 1, further comprising a sense resistor having a first terminal coupled to the base terminal of the amplifier transistor, wherein the reference voltage source comprises:
   a third transistor having a base terminal coupled to a second terminal of the sense resistor and an emitter terminal coupled to ground;
   a second resistor having a first terminal coupled to the supply voltage node, the second resistor having a second terminal coupled to a collector terminal of the third transistor;
   a fourth transistor having an emitter terminal coupled to the collector terminal of the third transistor, the fourth transistor having a collector terminal coupled to the supply voltage node, the fourth transistor having a base terminal connected to the collector terminal of the fourth transistor; and
   a fifth transistor having a base terminal coupled to the base terminal of the fourth transistor, the fifth transistor having a collector terminal coupled to the supply voltage node, the fifth transistor having an emitter terminal coupled to the reference voltage output node.

6. The amplifier circuit of claim 1, further comprising a sense resistor having a first terminal coupled to the base terminal of the amplifier transistor, wherein the reference voltage source comprises:
  a third transistor having a base terminal coupled to a second terminal of the sense resistor, the third transistor having an emitter terminal coupled to ground and a collector terminal coupled to the reference voltage output node; and
  a second resistor having a first terminal coupled to the supply voltage node, the second resistor having a second terminal coupled to the reference voltage output node.

7. The amplifier circuit of claim 6, wherein the reference voltage source further comprises a third resistor connected between the reference voltage output node and the collector terminal of the third transistor.

8. A bias voltage generating circuit comprising:
  a reference voltage source operable to generate a reference voltage at a reference voltage output node;
  a first local bias circuit operable to generate a first bias voltage at a first bias node, the first local bias circuit having:
    a first transistor having an emitter terminal coupled to the reference voltage output node, the first transistor having a collector terminal coupled to a supply voltage node, the first transistor having a base terminal connected to the collector terminal of the first transistor; and
    a second transistor having a base terminal coupled to the base terminal of the first transistor, the second transistor having a collector terminal coupled to the supply voltage node, the second transistor having an emitter terminal coupled to the first bias node; and
  a second local bias circuit operable to generate a second bias voltage at a second bias node, the second local bias circuit having:
    a third transistor having an emitter terminal coupled to the reference voltage output node, the third transistor having a collector terminal coupled to the supply voltage node, the third transistor having a base terminal connected to the collector terminal of the third transistor; and
    a fourth transistor having a base terminal coupled to the base terminal of the third transistor, the fourth transistor having a collector terminal coupled to the supply voltage node, the fourth transistor having an emitter terminal coupled to the second bias node.

9. The amplifier circuit of claim 1 further comprising a DC blocking capacitor coupled between the base terminal of the amplifier transistor and a node receiving the input signal.

10. The amplifier cell of claim 1, wherein the first and the second transistors comprise matched transistors.

11. The amplifier cell of claim 1, wherein the first and the second transistors are located within thermal proximity of each other.

12. The amplifier cell of claim 1, wherein the input signal comprises a radio frequency signal, and the base terminal of the amplifying transistor is coupled to receive the input signal via a DC blocking capacitor.

13. The amplifier cell of claim 1 further comprising a ballast resistor coupled between the emitter terminal of the second transistor and the base terminal of the amplifying transistor.

14. The amplifier cell of claim 1, wherein a magnitude of the reference voltage is approximately equal to one transistor threshold voltage.

15. The amplifier cell of claim 1 further comprising a sense resistor coupled between the base terminal of the amplifying transistor and a reference voltage source providing the reference voltage.

16. The amplifier cell of claim 1, wherein the amplifying transistor further comprises an emitter terminal coupled to ground via a third resistor.

17. A transistor biasing method, comprising the acts of:
  providing an amplifying transistor to receive a radio frequency signal at a base terminal of the amplifying transistor and to output an amplified radio frequency signal at a collector terminal of the amplifying transistor;
  coupling an emitter terminal of a first transistor to the base terminal of the amplifying transistor;
  coupling a base terminal of a second transistor to a base terminal of the first transistor, coupling a collector terminal of the second transistor to the base terminal of the second transistor, and coupling an emitter terminal of the second transistor to a reference voltage source via a resistor; and
  using a base-emitter voltage of the second transistor to control a base-emitter voltage of the first transistor, the base-emitter voltage of the first transistor defining a bias voltage at the base terminal of the amplifier transistor.

18. The method of claim 17, further comprising the acts of:
  coupling the collector terminal to a voltage source via a second resistor; and
  controlling the bias voltage by maintaining a substantially constant current through the second resistor as the current through the first resistor decreases.

19. The method of claim 17, further comprising the act of positioning the first and the second transistors in thermal proximity such that if the first transistor experiences a particular temperature change and associated change in base-emitter voltage, then the second transistor experiences substantially the same particular temperature change and associate change in base-emitter voltage.

20. The method of claim 17, further comprising the acts of:
  coupling a sense resistor between the base terminal of the amplifying transistor and the reference voltage source; and
  using the coupled sense resistor to stabilize the bias voltage at the base terminal of the amplifying transistor.

* * * * *